(12) United States Patent
Jiang et al.

(10) Patent No.: US 11,244,099 B1
(45) Date of Patent: Feb. 8, 2022

(54) MACHINE-LEARNING BASED PREDICTION METHOD FOR ITERATIVE CLUSTERING DURING CLOCK TREE SYNTHESIS

(71) Applicant: Cadence Design Systems, Inc., San Jose, CA (US)

(72) Inventors: Bentian Jiang, Shatin (HK); Natarajan Viswanathan, Austin, TX (US); Zhuo Li, Austin, TX (US); Yi-Xiao Ding, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/139,675

(22) Filed: Dec. 31, 2020

(51) Int. Cl.
| | |
|---|---|
| *G06F 30/396* | (2020.01) |
| *G06N 20/00* | (2019.01) |
| *G06N 5/04* | (2006.01) |
| *G06F 30/3312* | (2020.01) |
| *G06F 30/398* | (2020.01) |
| *G06F 30/392* | (2020.01) |

(52) U.S. Cl.
CPC ........ *G06F 30/396* (2020.01); *G06F 30/3312* (2020.01); *G06F 30/392* (2020.01); *G06F 30/398* (2020.01); *G06N 5/04* (2013.01); *G06N 20/00* (2019.01)

(58) Field of Classification Search
USPC ........................................................ 716/112
See application file for complete search history.

(56) References Cited

U.S. PATENT DOCUMENTS

| | | | |
|---|---|---|---|
| 2021/0073456 A1* | 3/2021 | Nath | .................... G06F 30/3953 |
| 2021/0117603 A1* | 4/2021 | Jiang | .................... G06F 30/392 |

* cited by examiner

*Primary Examiner* — Mohammed Alam
(74) *Attorney, Agent, or Firm* — Schwegman Lundberg & Woessner, P.A.

(57) ABSTRACT

Aspects of the present disclosure address systems and methods for performing a machine-learning based clustering of dock sinks during clock tree synthesis. An integrated circuit design comprising a clock net that includes a plurality of clock sinks is accessed. A set of clusters are generated by clustering the set of clock objects of the clock net. A machine-learning model is used to assess whether each cluster satisfies one or more design rule constraints. Based on determining each cluster in the set of dusters is assessed by the machine-learning model to satisfy the one or more design rule constraints, a timing analysis is performed to determine whether each cluster in the set of clusters satisfies the target timing constraints. A clustering solution for the clock net is generated based on the set of clusters in response to determining each cluster satisfies the one or more design rule constraints.

18 Claims, 5 Drawing Sheets

MACHINE-LEARNING BASED PREDICTION METHOD FOR ITERATIVE CLUSTERING DURING CLOCK TREE SYNTHESIS

TECHNICAL FIELD

The present disclosure generally relates to the technical field of integrated circuit (IC) design. In particular, the present disclosure addresses systems and methods for designing a clock tree for an IC.

BACKGROUND

An IC layout specifies portions of various components of an IC. When the IC is to include a large number of registers, latches, flip-flops, and/or other types of clocked devices ("sinks") that are to be clocked by one or more clocks, the IC must include one or more clock trees for delivering the clock signal from the clock source to all of the sinks to be clocked by it. A clock tree distributes a clock signal from its root to a set of sinks within an IC through a branching network of fan-out buffers, clock gates, and/or other types of clock logic (collectively referred to hereinafter as "dock nodes"). A clock tree includes a hierarchy of fan-out buffers (which may or may not invert the clock signal), clock gates, and/or clock logic for fanning the clock tree out from one or more buffers at a top level of the hierarchy to a large number of buffers or clock gates at the lowest level of the hierarchy that drive the clock inputs of the sinks.

After establishing positions of all clock nodes and routing signal paths between the clock nodes and the sinks, a clock tree synthesis (CTS) tool estimates the path delays from the clock tree root to all sinks and then inserts additional buffers into various branches of the clock tree as needed to reduce variations in path delays to the sinks, thereby balancing the clock tree. Conventional approaches to positioning fan-out buffers involve grouping sinks in a process referred to as "clustering." During clustering, sinks are grouped into a set of clusters such that each cluster has no more than the number of sinks that can be driven by a single fan-out buffer. Sinks are typically clustered using one of two approaches a geometry-based approach and a load-based approach.

In an example of the conventional geometry-based approach to clustering, sinks are grouped into clusters such that the clusters have approximately equal spans. In an example of the conventional load-based approach to clustering, sinks are grouped into clusters such that the clusters have approximately equal loads (e.g., total pin and wire capacitance). In both approaches, reclustering may be performed iteratively until design rule constraints are satisfied. Conventional techniques either explicitly split clusters that fail design rule constraints or increase the number of clusters and perform a global reclustering pass until all clusters satisfy design constraints. Further, at each clustering iteration, a timing analysis is performed to evaluate clusters to ensure that design constraints are satisfied, and if they are not, an additional iteration is performed to generate a new set of clusters. In many instances, several iterations of reclustering are performed to reach a clustering solution in which all clusters satisfy the design rule constraints. However, evaluating clusters at each iteration, especially when there are a large number of sinks in the design, can be overly time consuming and computationally expensive in terms of computing resources that are utilized.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
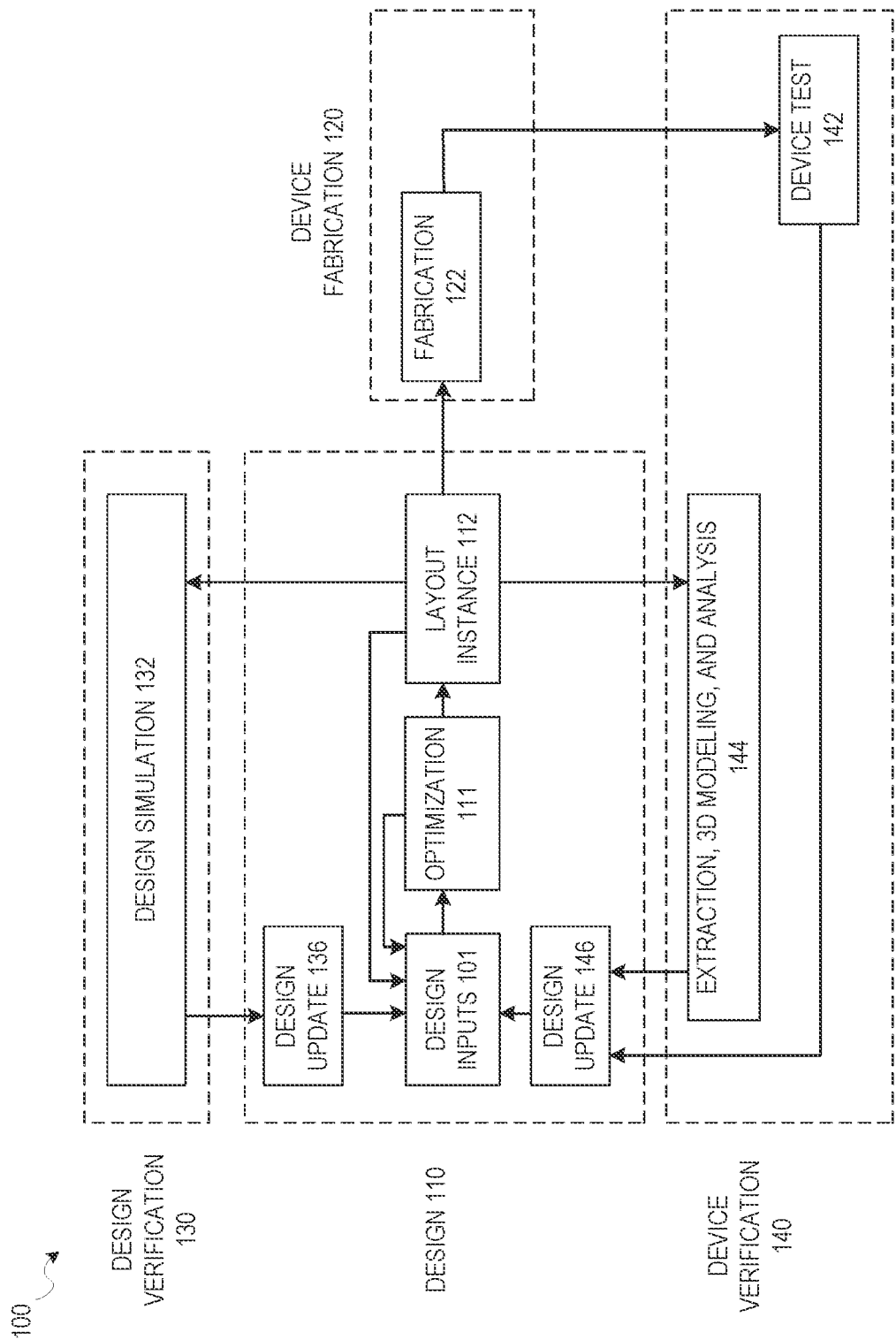
FIG. 1 is a diagram illustrating a possible design process flow that includes a machine-learning based prediction method for clustering clock objects during CTS, according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, traditional techniques for clustering involve multiple cluster evaluations, which can be overly time consuming and computationally expensive. Aspects of the present disclosure address the deficiencies of conventional clustering techniques by using a machine-learning model to assess clusters and predict whether clusters satisfy design rule constraints. An machine-learning algorithm may be used to train and generate the machine-learning model in an offline processing using training data that includes clusters labeled according to their satisfaction of design rule constraints (e.g., "Passing" or "Failing"). In training the machine-learning model, the machine-learning algorithm utilizes the training data to find correlations among features that affect whether clusters satisfy design rule constraints. These features may, for example, include driver location, driver size, input slew of driver, number of sinks, sink sizes, sink locations, bounding box area, average clock net radius, routing topology, total wirelength, and resistance and capacitance characteristics.

At runtime, a set of clusters is generated by grouping clock objects (e.g., sink) of a clock net. The set of clusters includes K clusters. The set of clusters are evaluated using the machine-learning learning model trained to predict whether clusters satisfy design rule constraints. The design rule constraint may set forth timing and loading targets such as targets for transition, skew, and total capacitance of clusters. If one or more clusters are predicted to fail by virtue of not satisfying a design rule constraint, K is incremented, and a new set of clusters is generated having the incremented number of clusters. The process repeats until all clusters are predicted by the machine-learning model to satisfy design rule constraints. Based on the machine-learning model predicting that all clusters satisfy the design rule constraints, a more robust timing analysis is performed to verify that the set of clusters satisfy the design rule constraints. If the timing analysis reveals that at least one cluster fails to satisfy design rule constraints, one or more local cluster refinements may be performed or the number of clusters, K, may be increased and the process is repeated until all clusters are determined to satisfy the design rule constraints based on the timing analysis. A clustering solution for the clock net is generated based on the set of clusters.

Utilizing the machine-learning model to evaluate clusters rather than performing a computationally expensive timing analysis, reduces the computational overhead required to arrive at the clustering solution in which all clusters satisfy design rule constraints. Along with the reduction to computational resource consumption, the utilization of the machine-learning model in clustering clock sinks also reduces the amount of time consumed in generating the clustering solution because the machine-learning model is able to output a prediction of whether clusters satisfy design rule constraints more quickly than this could be determined by performing a timing analysis.

FIG. 1 is a diagram illustrating one possible design process flow which includes elements for performing clustering to construct a clock tree structure, according to some embodiments. It will be apparent that other design flow operations may function using the timing constraints and optimizations described herein, but a design flow 100 is described here for the purposes of illustration. As illustrated, the design flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. This design input operation 101 is where a CTS tool generates initial layouts for a clock tree structure and sinks, before refinements are made to ensure that timing requirements for each sink are met. The initial layouts for the balanced clock tree structure and sinks include an initial clustering solution for grouping the sinks. The initial strategy, tactics, and context for the device to be created are also generated in the design input operation 101, depending on the particular design algorithm to be used.

In some embodiments, following an initial selection of design values in the design input operation 101, the CTS tool performs clock tree synthesis and associated timing analysis and optimization (e.g., refinements to the clock tree structure) according to various embodiments, along with any other automated design processes, at an optimization operation 111. The clock tree synthesis process performed by the CTS tool includes generating a clustering solution by clustering clock sinks. Design rule constraints for a clock tree structure and sinks which receive a clock signal from the clock tree structure may be initiated with design inputs in the design input operation 101, and then may be analyzed using a machine-learning model and subsequent timing analysis according to various embodiments. While the design flow 100 shows such optimization occurring prior to a layout instance 112, such timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 122. Certain embodiments of operations described herein for generating and refining a clock tree structure may therefore involve iterations of the design input operation 101, optimization operation 111, and layout instance 112 generation. In other systems, other design processes may be used.

After design inputs are used in the design input operation 101 to generate a circuit layout, and any optimization operations 111 (e.g., local refinement transforms) are performed, a layout is generated in the layout instance 112. The layout describes the physical layout dimensions of the device that match the design inputs. This layout may then be used in the device fabrication operation 122 to generate a device, or additional testing and design updates may be performed using designer inputs or automated updates based on design simulation 132 operations, or extraction, 3D modeling, and analysis 144 operations. Once the device is generated, the device can be tested as part of device test 142 operations, and layout modifications generated based on actual device performance.

As described in more detail below, design updates 136 from the design simulation 132 operations; design updates 146 from the device test 142 or extraction, 3D modeling, and analysis 144 operations; or further direct design input operations 101 may occur after an initial layout instance 112 is generated. In various embodiments, whenever design inputs are used to update or change an aspect of a circuit design, a timing analysis and an optimization operation 111 may be performed.

Figure 2:
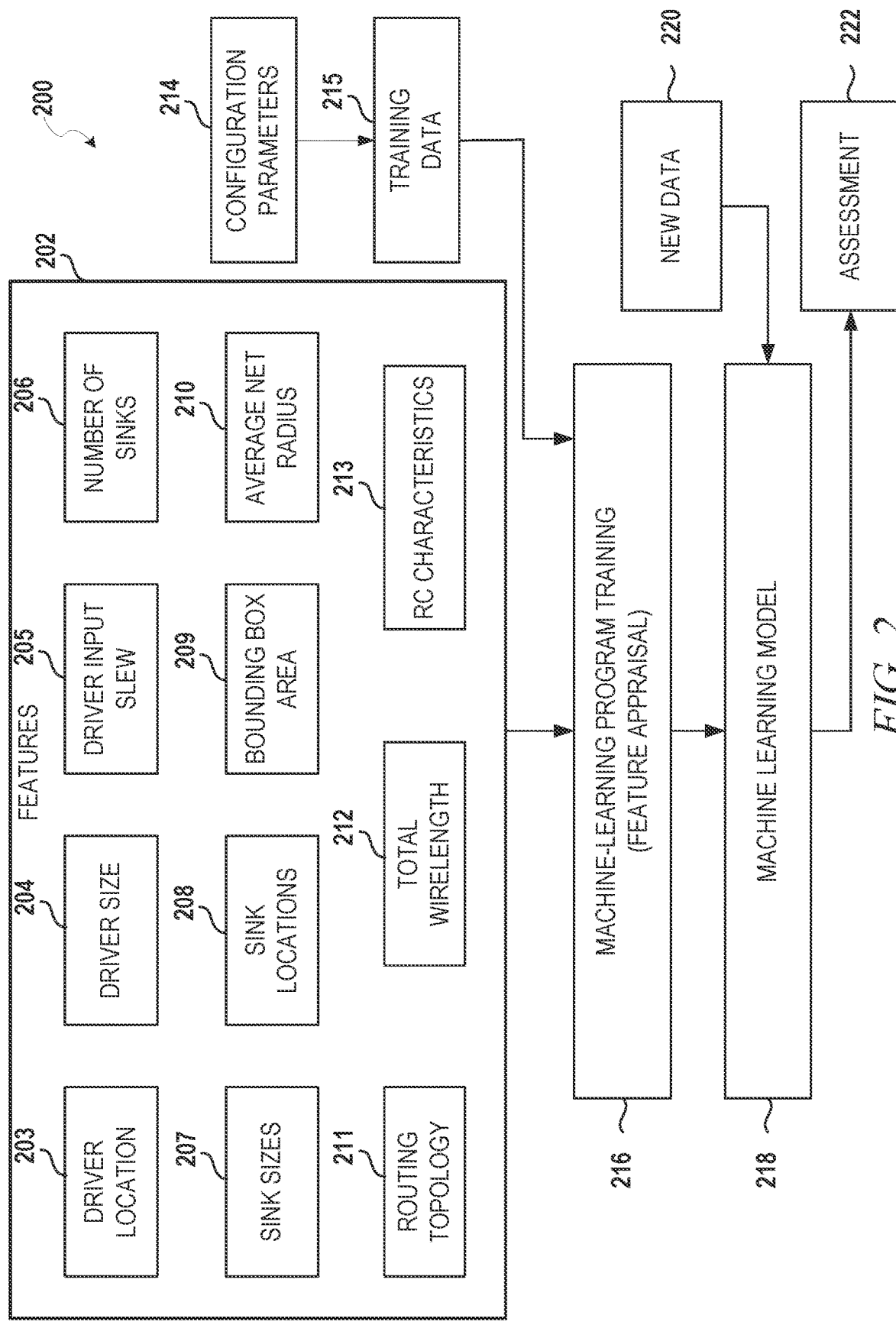
FIG. 2 is a flowchart illustrating operations of a method for generating a machine-learning model for use in clustering clock objects during CTS, according to some embodiments.

FIG. 2 is a flowchart illustrating operations of a method 200 for generating a machine-learning model for use in clustering clock objects during CTS, according to some embodiments. In some example embodiments, machine-learning programs, also referred to as machine-learning algorithms or tools, are utilized to perform operations associated with clustering clock objects during CTS, such as evaluating whether clusters of clock objects satisfy timing constraints.

It will be understood that the method 200 may be performed by a computing device. For example, one or more operations of the method 200 may be represented by executable instructions that, when executed by a processor of a computing device, cause the computing device to perform the method 200. Thus, an operation of the method 200 may be performed by a hardware processor (e.g., central processing unit or graphics processing unit) of a computing device (e.g., desktop, server, etc.). Accordingly, the method 200 is described below in reference to such a computing device.

Machine-learning is an application that provides computer systems the ability to perform tasks, without explicitly being programmed, by making inferences based on patterns found in the analysis of data. Machine-learning explores the study and construction of algorithms, also referred to herein as tools, that may learn from existing data and make predictions about new data. Such machine-learning algorithms operate by building an machine-learning model 218 from example training data 215 in order to make data-driven predictions or decisions expressed as outputs or assessments 222. Although example embodiments are presented with respect to a few machine-learning tools, the principles presented herein may be applied to other machine-learning tools.

Data representation refers to the method of organizing the data for storage on a computer system, including the structure for the identified features and their values. In machine-learning, it is typical to represent the data in vectors or matrices of two or more dimensions. When dealing with large amounts of data and many features, data representation is important so that, the training is able to identify the correlations within the data.

There are two common modes for machine-learning: supervised machine-learning and unsupervised machine-learning. Supervised machine-learning uses prior knowledge (e.g., examples that correlate inputs to outputs or outcomes) to learn the relationships between the inputs and the outputs. The goal of supervised machine-learning is to learn a function that, given some training data, best approximates the relationship between the training inputs and outputs so that the machine-learning model can implement the same relationships when given inputs to generate the corresponding outputs. Unsupervised machine-learning is the training of an machine-learning algorithm using information that is neither classified nor labeled, and allowing the algorithm to act on that information without guidance. Unsupervised machine-learning is useful in exploratory analysis because it can automatically identify structure in data.

Common tasks for supervised machine-learning are classification problems and regression problems. Classification problems, also referred to as categorization problems, aim at classifying items into one of several category values (for example, is this object an apple or an orange?). Regression algorithms aim at quantifying some items (for example, by providing a score to the value of some input). Some examples of commonly used supervised-machine-learning algorithms are Logistic Regression (LR), Naive-Bayes, Random Forest (RF), neural networks (NN), deep neural networks (DNN), matrix factorization, and Support Vector Machines (SVM).

Some common tasks for unsupervised machine-learning include clustering, representation learning, and density estimation. Some examples of commonly used unsupervised-machine-learning algorithms are K-means clustering, principal component analysis, and autoencoders.

In some embodiments, example machine-learning model 218 provides an assessment (prediction) of whether a set of clustered clock objects satisfy design rule constraints such as a timing target.

The training data 215 comprises examples of values for a set of features 202. In some example embodiments, the training data comprises labeled data with examples of values for the features 202 and labels indicating the outcome. The labeled data includes clusters of clock sinks and the labels indicate outcomes, such as whether clusters are "Passing" or "Failing" based on whether the clusters satisfy design rule constraints. That is, clusters in the training data may be labeled as "Passing" if they satisfy design rule constraints and "Failing" if they do not satisfy design rule constraints. In an example, a given cluster's category is determined based on a comparison of timing characteristics of the cluster with a timing target.

The machine-learning algorithms utilize the training data 215 to find correlations among the set of identified features 202 that affect the outcome. A feature 202 is an individual measurable property of a phenomenon being observed. The concept of a feature is related to that of an explanatory variable used in statistical techniques such as linear regression. Choosing informative, discriminating, and independent features is important for effective operation of machine-learning in pattern recognition, classification, and regression. Features may be of different types, such as numeric features, strings, and graphs.

Feature extraction is a process to reduce the amount of resources required to describe a large set of data. When performing analysis of complex data, one of the major problems is one that stems from the number of variables involved. Analysis with a large number of variables generally requires a large amount of memory and computational power, and it may cause a classification algorithm to overfit to training samples and generalize poorly to new samples. Feature extraction includes constructing combinations of variables to get around these large-data-set problems while still describing the data with sufficient accuracy for the desired purpose.

In some example embodiments, feature extraction starts from an initial set of measured data and builds derived values (features) intended to be informative and non-redundant, facilitating the subsequent learning and generalization steps. Further, feature extraction is related to dimensionality reduction, such as reducing large vectors (sometimes with very sparse data) to smaller vectors capturing the same, or a similar, amount of information.

In one example embodiment, the features 202 may be of different types and may include one or more of driver location 203, driver size 204, input slew of driver 205, number of sinks 206, sink sizes 207, sink locations 208, bounding box area 209, average clock net radius 210, routing topology 211, total wirelength 212, and RC characteristics 213.

During training 216, the machine-learning algorithm analyzes the training data 215 based on identified features 202 and configuration parameters 214 defined for the training. The result of the training 216 is an machine-learning model 218 that is capable of taking inputs to produce assessments.

Training a machine-learning algorithm involves analyzing large amounts of data (e.g., from several gigabytes to a terabyte or more) in order to find data correlations. The machine-learning algorithms utilize the training data 215 to find correlations among the identified features 202 that affect the outcome or assessment 222. In some example embodiments, the training data 215 includes labeled data, which is known data for one or more identified features 202 and one or more outcomes such as whether clusters are passing or failing in relation to their satisfaction of timing target constraints.

The machine-learning algorithms usually explore many possible functions and parameters before finding what the machine-learning algorithms identify to be the best correlations within the data; therefore, training may require large amounts of computing resources and time.

Many machine-learning algorithms include configuration parameters 214, and the more complex the machine-learning algorithm, the more parameters there are that are available to the user. The configuration parameters 214 define variables for a machine-learning algorithm in the search for the best machine-learning model. The training parameters include model parameters and hyperparameters. Model parameters are learned from the training data, whereas hyperparameters are not learned from the training data, but instead are provided to the machine-learning algorithm.

Some examples of model parameters include maximum model size, maximum number of passes over the training data, data shuffle type, regression coefficients, decision tree split locations, and the like. Hyperparameters may include the number of hidden layers in a neural network, the number of hidden nodes in each layer, the learning rate (perhaps with various adaptation schemes for the learning rate), the regularization parameters, types of nonlinear activation functions, and the like. Finding the correct (or the best) set of hyperparameters can be a very time-consuming task that requires a large amount of computer resources.

When the machine-learning model 218 is used to perform an assessment, new data 220 is provided as an input to the machine-learning model 218, and the machine-learning model 218 generates the assessment 222 as output. For example, when clusters of clock objects of a give clock net are evaluated, the machine-learning program utilizes information describing the clock net, the driver, and the sinks to assess whether the clusters satisfy timing target constraints.

Figure 3:
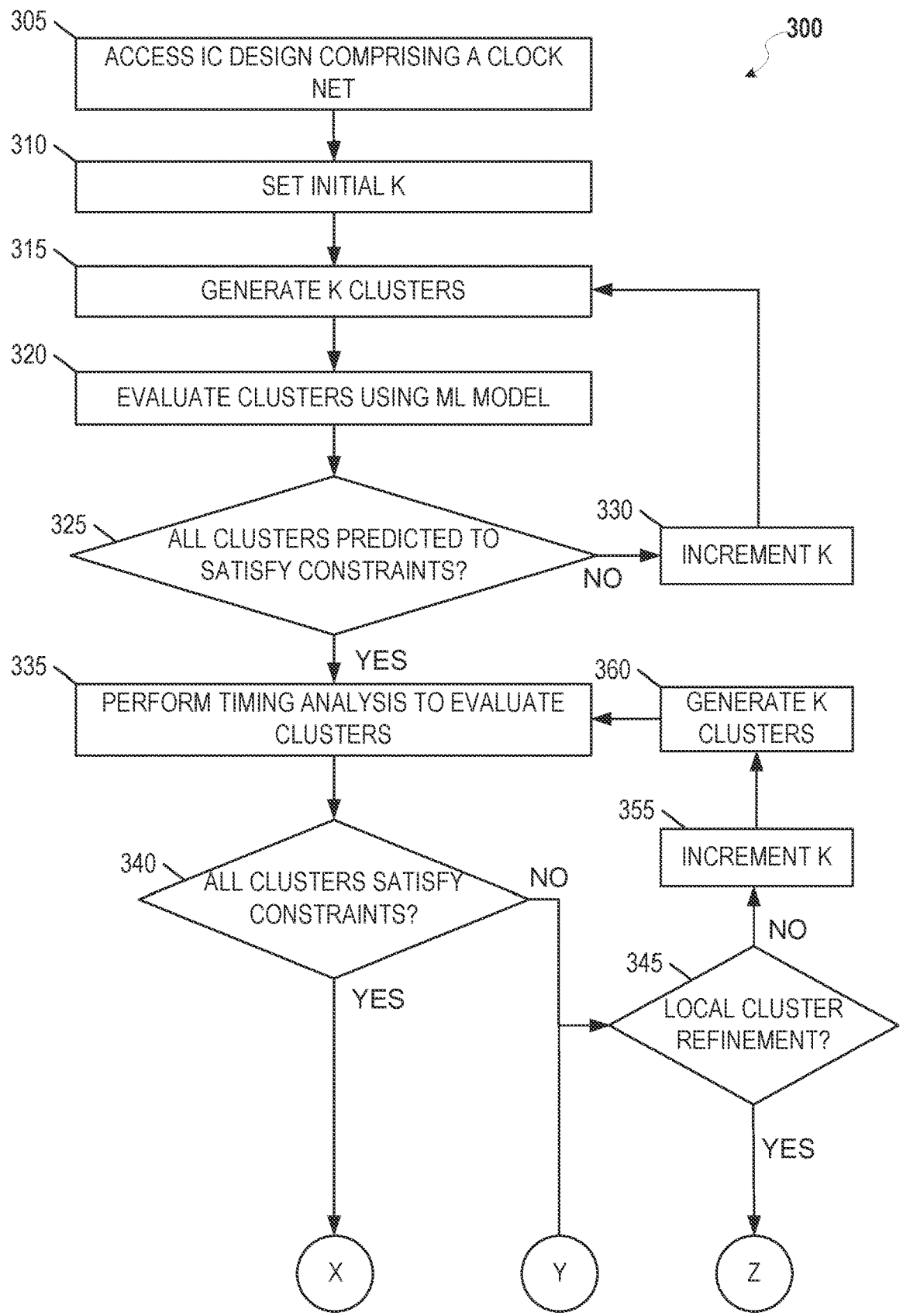
FIGS. 3-4 are flowcharts illustrating operations of a machine-learning based prediction method for clustering clock objects during CTS, according to some embodiments.
Figure 4:
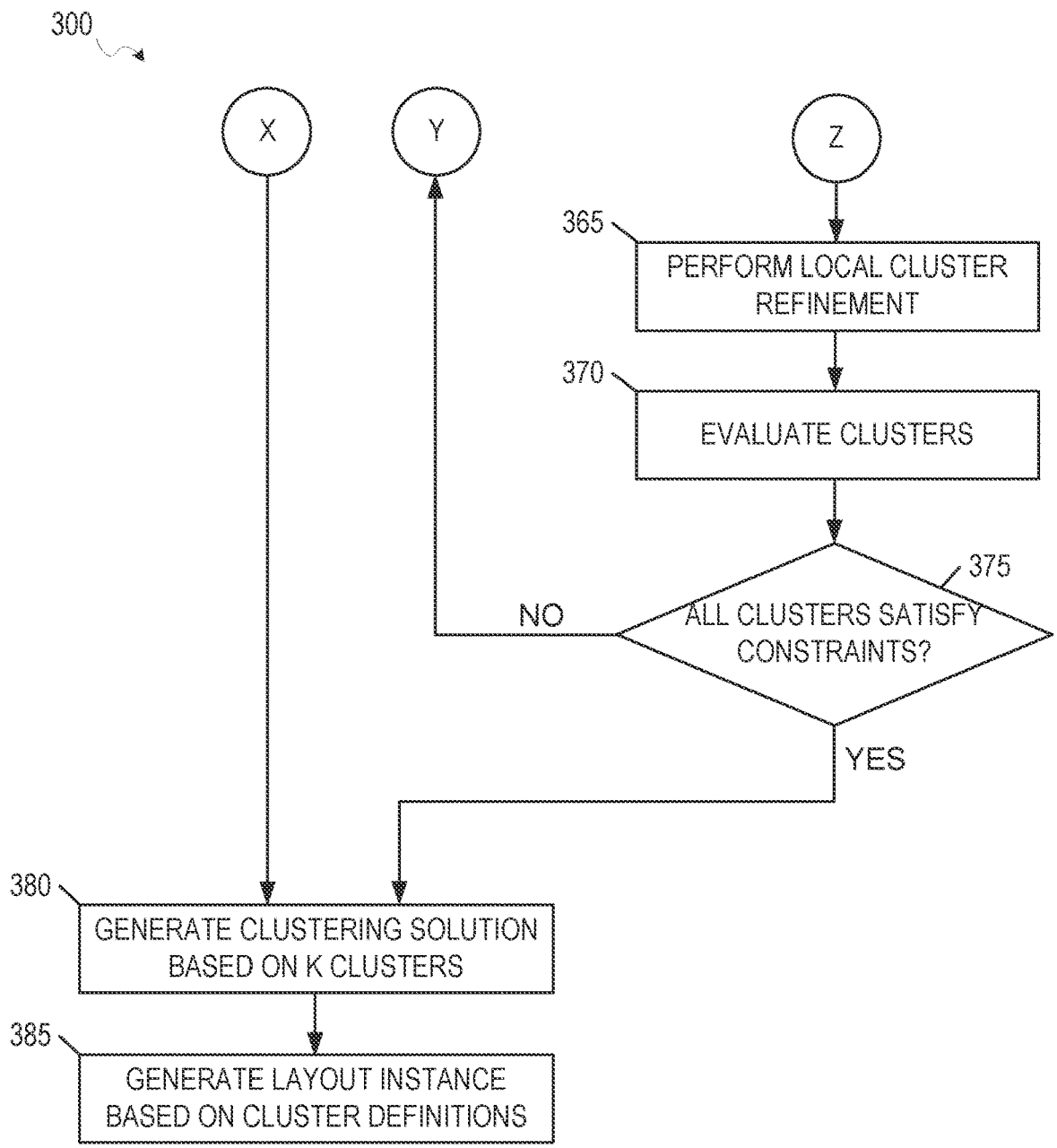

FIGS. 3-4 are flowcharts illustrating operations of a machine-learning based prediction method 300 for clustering clock objects during CTS, according to some embodiments. For some embodiments, the method 200 is performed as part of a place and route process applied to a circuit design (e.g, by an EDA software system).

It will be understood that the method 300 may be performed by a computing device, such as a computing device executing instructions of an EDA software system that includes a CTS tool. For example, the operations of a method 300 may be represented by executable instructions (e.g., EDA software) that, when executed by a processor of a computing device, cause the computing device to perform the method 300. Thus, an operation of the method 300 may be performed by a hardware processor (e.g., central processing unit or graphics processing unit) of a computing device (e.g., desktop, server, etc.). Accordingly, the method 300 is described below in reference to such a computing device.

Depending on the embodiment, an operation of the method 300 may be repeated in different ways or involve intervening operations not shown. Though the operations of the method 300 may be depicted and described in a certain order, the order in which the operations are performed may vary among embodiments, including performing certain operations in parallel.

At operation 305, the computing device accesses an IC design from memory. The IC design comprises a clock net and a set of clock objects (e.g., clock buffers, clock inverters, clock gates, registers, latches, and flip-flops), each of which receives a clock signal.

The computing device, at operation 310, determines an initial number of clusters, K, to generate from the clock objects of the clock net. The initial may be set based on a predetermined default value.

The computing device generates a set of clusters from the clock objects in the clock net, at operation 315. The set of clusters comprises K clusters. Each cluster comprises a grouping of clock sinks. As an example, the computing device may use a geometry-based approach to clustering where clock sinks are grouped into clusters such that all clusters have approximately equal spans. As another example, the computing device may us a load-based approach to clustering where clock sinks are grouped into clusters such that all clusters have approximately equal loads (e.g., total pin and wire capacitance).

At operation 320, the computing device evaluates each cluster in the set of clusters using a machine-learning model that is trained to assess whether clusters satisfy design rule constraints such as a timing targets (e.g., the machine-learning module training 216). The machine-learning module provides the computing device with an assessment of whether all clusters are assessed to satisfy or violate the target timing constraints (operation 325). In some embodiments, an assessment by the machine-learning model may indicate whether a cluster is "Passing" (if the cluster satisfies design constraints) or "Failing" (if the cluster violates design constraints).

If, at operation 325, the computing device that at least one cluster of the K clusters is assessed to violate a design rule constraint such as the timing target (e.g., based on the machine-learning model providing an assessment that at least one cluster is "Failing"), the computing device increments K, at operation 330, and the method 300 returns to operation 315 where the process is repeated using the updated K value.

Otherwise, if at operation 325, the computing device determines that all clusters are assessed to satisfy the target timing constraints (e.g., based on the machine-learning model providing an assessment that all clusters are "Passing"), the method 300 proceeds to operation 335, where the computing device performs a timing analysis to evaluate the clusters. In performing the timing analysis, the computing device uses a timer to measure timing characteristics of each cluster and compares the timing characteristics of each cluster with the target timing constraints. For example, the computing device may use a timer to analyze each cluster to determine the slew of each cluster and compare the slew of each cluster to a target slew imposed by the design rule constraints. In another example, the computing device may analyze each cluster to determine the skew of each cluster and compare the skew of each cluster to a target skew imposed by the design rule constraints.

At operation 340, the computing device determines whether all clusters satisfy the target timing constraints based on the timing analysis. If, at operation 340, the computing device determines that at least one cluster in the set of clusters does not satisfy the target timing constraints, the method 300 proceeds to operation 345 where the computing device determines whether to perform local cluster refinement on one or more clusters. The computing device may determine whether to perform local cluster refinement based on a number of "failing" clusters in the set of clusters. In an embodiment, the computing device may perform local cluster refinement if the number of "failing" clusters in the set of clusters satisfies a threshold conditions such as a threshold percentage. For example, the computing device may perform local cluster refinement on the set of clusters if less than 25% of clusters in the set are failing.

If, at operation 345, the computing device determines that local cluster refinement is not to be performed, the computing device increments K, at operation 355, and generates a set of clusters comprising K clusters, at operation 360. The method returns to operation 335 where the computing device performs the timing analysis to evaluate the set of clusters with the updated number of clusters.

If the computing device determines that local cluster refinement is to be performed, the method 300 proceeds to operation 365, illustrated in FIG. 4, where the computing device performs local cluster refinement on one or more clusters. In performing local cluster refinement, the computing device may perform one or more of pin move refinements and local reclustering processes.

Pin move refinement includes evaluating the set of clusters in accordance with design rule constraints that comprise targets for transition, skew, and total capacitance of clusters and classifying each cluster according to the evaluation. Based on the evaluation, the computing device may classify each cluster as "Failing," or "Passing." The computing device moves pins from each failing cluster to nearby passing clusters to generate refined clusters that meet design rule constraints.

Local reclustering also includes evaluating the set of clusters to classify each cluster with respect to satisfaction of design rule constraints (e.g., as "Failing," and "Passing"). The process of local reclustering further includes determining failing clusters and dissolving the failed cluster and nearby clusters, which results in a set of unclustered pins. The process further includes regrouping the unclustered pins to form a refined set of clusters that meet design rule constraints that include at least one more cluster than before the original clusters were dissolved.

In evaluating the set of clusters during both pin move refinement and local reclustering, the computing device may utilize the machine-learning model to provide an assessment that includes a classification of each cluster with respect to satisfaction of design rule constraints. In addition to or in the alternative, the computing device may determine timing and loading characteristics of the clusters and compare the determined characteristics with one or more timing or loading targets.

At operation 370, the computing device evaluates the set of clusters to determine whether all clusters satisfy design constraints after performing local refinement processes. In evaluating the set of clusters, the computing device may use the machine-learning model to provide an assessment of whether each cluster satisfies or violates design rule constraints, or use a timer to perform a timing analysis to determining timing characteristics of each cluster and compare those against design rule constraints, or combinations of both.

If the computing device determines (at operation 375) that at least one cluster fails to satisfy design constraints, the method returns to operation 345 where the computing device determines whether to perform further local cluster refinement on the set of clusters.

As shown in FIG. 4, if the computing device determines that all clusters satisfy the target timing and design rule constraints at operation 375, the method 300 proceeds to operation 380, where the computing device generates a clustering solution based on the set of clusters having the current K number of clusters. The clustering solution defines the K clusters, each of which comprises a group of clock sinks.

At operation 385, the computing device generates a layout instance of the IC design based on the clustering solution. The layout instance defines physical dimensions of the IC design.

Figure 5:
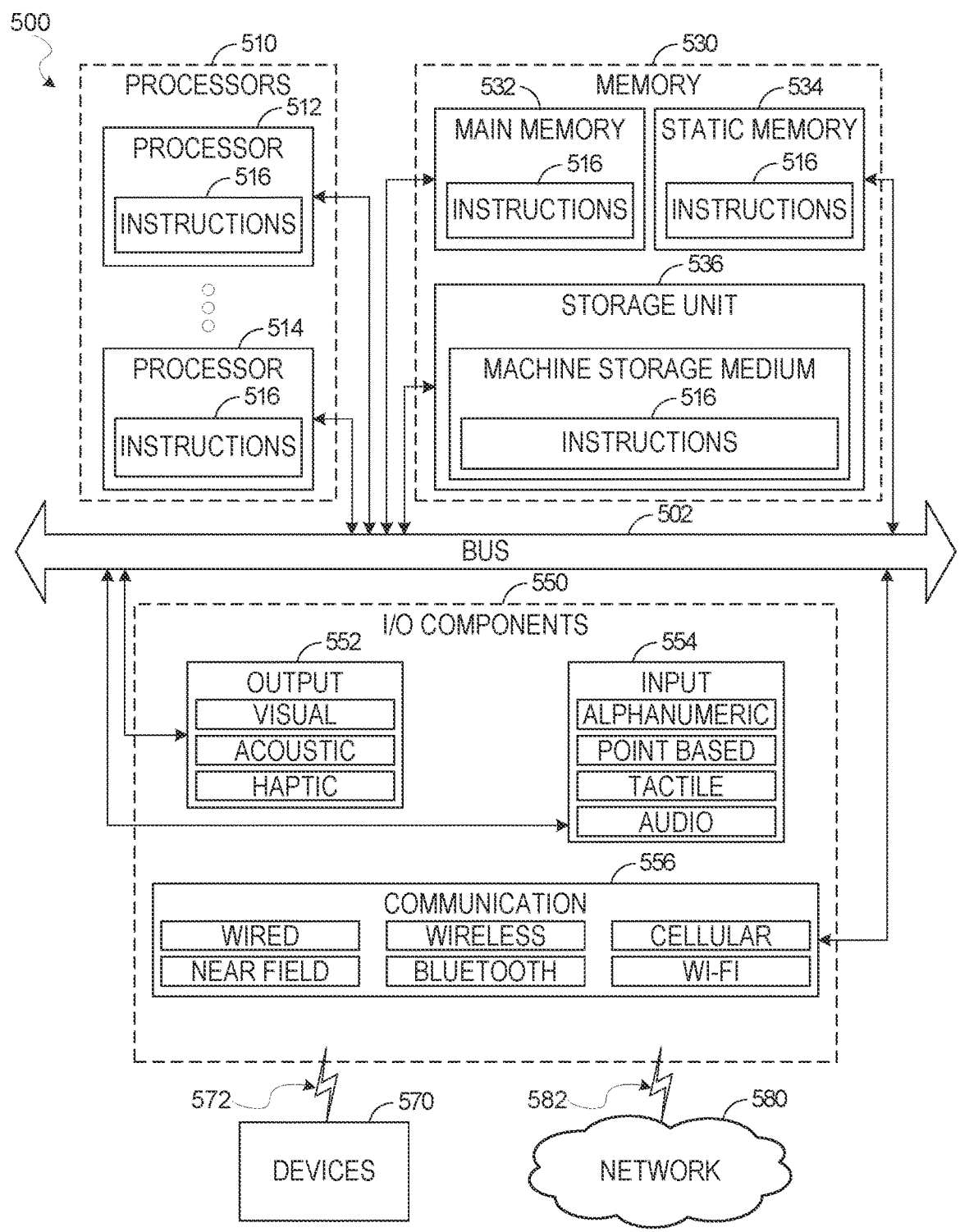
FIG. 5 is a diagrammatic representation of a machine in the example form of a computer system within which a set of instructions for causing the machine to perform any one or more of the methodologies discussed herein may be stored and executed.

FIG. 5 illustrates a diagrammatic representation of a machine 500 in the form of a computer system within which a set of instructions may be executed for causing the machine 500 to perform any one or more of the methodologies discussed herein, according to an example embodiment. Specifically, FIG. 5 shows a diagrammatic representation of the machine 500 in the example form of a computer system, within which instructions 516 (e.g., software, a program, an application, an apple, an app, or other executable code) for causing the machine 500 to perform any one or more of the methodologies discussed herein may be executed. For example, the instructions 516 may cause the machine 500 to execute methods 200 and 300. Additionally, or alternatively, the instructions 516 may implement the design flow 100 of FIG. 1. The instructions 516 transform the general, non-programmed machine 500 into a particular machine 500 programmed to carry out the described and illustrated functions in the manner described here. In alternative embodiments, the machine 500 operates as a standalone device or may be coupled (e.g., networked) to other machines. In a networked deployment, the machine 500 may operate in the capacity of a server machine or a client machine in a server-client network environment, or as a peer machine in a peer-to-peer (or distributed) network environment. The machine 500 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 516, sequentially or otherwise, that specify actions to be taken by the machine 500. Further, while only a single machine 500 is illustrated, the term "machine" shall also be taken to include a collection of machines 500 that individually or jointly execute the instructions 516 to perform any one or more of the methodologies discussed herein.

The machine 500 may include processors 510, memory 530, and I/O components 550, which may be configured to communicate with each other such as via a bus 502. In an example embodiment, the processors 510 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 512 and a processor 514 that may execute the instructions 516. The term "processor" is intended to include multi-core processors 510 that may comprise two or more independent processors (sometimes referred to as "cores") that may execute instructions contemporaneously. Although FIG. 5 shows multiple processors, the machine 500 may include a single processor with a single core, a single processor with multiple cores (e.g., a multi-core processor), multiple processors with a single core, multiple processors with multiple cores, or any combination thereof.

The memory 530 may include a main memory 532, a static memory 534, and a storage unit 536, all accessible to the processors 510 such as via the bus 502. The main memory 532, the static memory 534, and the storage unit 536 store the instructions 516 embodying any one or more of the methodologies or functions described herein. The instructions 516 may also reside, completely or partially, within the main memory 532, within the static memory 534, within the storage unit 536, within at least one of the processors 510 (e.g., within the processor's cache memory), or any suitable combination thereof, during execution thereof by the machine 500.

The I/O components 550 may include a wide variety of components to receive input, provide output, produce output, transmit information, exchange information, capture measurements, and so on. The specific I/O components 550 that are included in a particular machine will depend on the type of machine. For example, portable machines such as mobile phones will likely include a touch input device or other such input mechanisms, while a headless server machine will likely not include such a touch input device. It will be appreciated that the I/O components 550 may include many other components that are not shown in FIG. 5. The I/O components 550 are grouped according to functionality merely for simplifying the following discussion and the grouping is in no way limiting. In various example embodiments, the I/O components 550 may include output components 552 and input components 554. The output components 552 may include visual components (e.g., a display such as a plasma display panel (PDP), a light-emitting diode (LED) display, a liquid crystal display (LCD), a projector, or a cathode ray tube (CRT)), acoustic components (e.g., speakers), other signal generators, and so forth. The input components 554 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 550 may include communication components 556 operable to couple the machine 500 to a network 580 or devices 570 via a coupling 582 and a coupling 572, respectively. For example, the communication components 556 may include a network interface component or another suitable device to interface with the network 580. In further examples, the communication components 556 may include wired communication components, wireless communication components, cellular communication components, and other communication components to provide communication via other modalities (e.g., near field, Bluetooth, and Wi-Fi). The devices 570 may be another machine or any of a wide variety of peripheral devices (e.g., a peripheral device coupled via a universal serial bus (USB)).

Executable Instructions and Machine Storage Medium

The various memories (e.g., 530, 532, 534, and/or the memory of the processor(s) 510) and/or the storage unit 536 may store one or more sets of instructions and data structures (e.g., software) embodying or utilized by any one or more of the methodologies or functions described herein. These instructions, when executed by the processor(s) 510, cause various operations to implement the disclosed embodiments.

As used herein, the terms "machine-storage medium," "device-storage medium," and "computer-storage medium" mean the same thing and may be used interchangeably. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Transmission Medium

In various example embodiments, one or more portions of the network 580 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 580 or a portion of the network 580 may include a wireless or cellular network, and the coupling 582 may be a Code Division Multiple Access (CDMA) connection, a Global System for Mobile communications (GSM) connection, or another type of cellular or wireless coupling. In this example, the coupling 582 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UNITS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 516 may be transmitted or received over the network 580 using a transmission medium via a network interface device (e.g., a network interface component included in the communication components 556) and utilizing any one of a number of well-known transfer protocols (e.g., hypertext transfer protocol (HTTP)). Similarly, the instructions 516 may be transmitted or received using a transmission medium via the coupling 572 (e.g., a peer-to-peer coupling) to the devices 570. The terms "transmission medium" and "signal medium" mean the same thing and may be used interchangeably in this disclosure. The terms "transmission medium" and "signal medium" shall be taken to include any, intangible medium that is capable of storing, encoding, or carrying the instructions 516 for execution by the machine 500, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
    one or more processors of a machine; and
    a computer-storage media storing instructions, which when executed by the one or more processors, configure the machine to perform operations comprising:
        accessing, from memory, an integrated circuit design comprising a clock net comprising a set of clock objects;
        generating a set of clusters by clustering the set of clock objects of the clock net, each cluster in the set of clusters comprising one or more clock objects from the set of clock objects;
        evaluating whether each cluster in the set of clusters satisfies one or more design rule constraints using a machine-learning model trained to assess cluster satisfaction of design rule constraints;
        based on determining each cluster in the set of clusters assessed by the machine-learning model satisfies the one or more design rule constraints, performing, using a timer, a timing analysis to determine whether each cluster in the set of clusters satisfies the one or more design rule constraints;
        generating a clustering solution for the clock net based on the set of clusters in response to determining each cluster satisfies the one or more design rule constraints; and
        generating a layout instance based on the clustering solution, the layout instance defining physical layout dimensions of the integrated circuit design.

2. The system of claim 1, wherein:
    the set of clusters is a first set of clusters comprising a first number of clusters;
    the operations further comprise:
    generating a second of clusters based on the set of clock objects, the second set of clusters comprising a second number of clusters, the second set of clusters being generated prior to the first set of clusters, the second number of clusters being less than the first number of clusters; and
    determining, based on the machine-learning model, that at least one cluster in the second set of clusters is assessed to fail to satisfy one or more of the design rule constraints, wherein the first set of clusters is generated to include an incremented number of clusters based on determining that at least one cluster in the second set of clusters is assessed to fail to satisfy one or more of the design rule constraints.

3. The system of claim 1, wherein the operations further comprise:
    prior to performing the timing analysis, performing one or more local cluster refinements on the set of clusters.

4. The system of claim 3, wherein:
    the operations further comprise:
    prior to performing the one or more cluster refinements, determining whether to perform the one or more local cluster refinements on the set of clusters based on a number of clusters indicated by a prior evaluation as failing to satisfy the one or more design rule constraints.

5. The system of claim 4, wherein the prior evaluation includes using the machine-learning model to assess one or more clusters fail to satisfy the one or more design rule constraints.

6. The system of claim 3, wherein performing the one or more local cluster refinements comprises one or more of:
    performing a pin move refinement on one or more clusters in the set of clusters; and performing local reclustering on one or more clusters in the set of clusters.

7. The system of claim 1, wherein the machine-learning model is generated by using one or more machine-learning algorithms to analyze training data to find correlations among a set of identified features that affect whether clusters satisfy design rule constraints.

8. The system of claim 7, wherein:
    the training data comprises clusters of clock sinks that are labeled according to respective satisfaction of the design rule constraints, and
    the set of identified features include one or more of: driver location, driver size, input slew of driver, number of sinks, sink sizes, sink locations, bounding box area, average clock net radius, routing topology, total wirelength, and resistance and capacitance characteristics.

9. The system of claim 1, wherein the one or more design rule constraints comprise at least one timing target.

10. A method comprising:

accessing, from memory, an integrated circuit design comprising a clock net comprising a set of clock Objects;

generating, by one or more hardware processors, a set of clusters by clustering the set of clock objects of the clock net, each cluster in the set of clusters comprising one or more clock objects from the set of clock objects;

evaluating whether each cluster in the set of clusters satisfies one or more design rule constraints using a machine-learning model trained to assess cluster satisfaction of design rule constraints;

based on determining each cluster in the set of clusters assessed by the machine-learning model satisfies the one or more design rule constraints, performing, using a timer, a timing analysis to determine whether each cluster in the set of clusters satisfies a target timing constraint based on a timing analysis;

generating a clustering solution for the clock net based on the set of clusters in response to determining each cluster satisfies the one or more design rule constraints; and generating a layout instance based on the clustering solution, the layout instance defining physical layout dimensions of the integrated circuit design.

11. The method of claim 10, wherein:

the set of clusters is a first set of clusters comprising a first number of clusters;

the operations further comprise:

generating a second of clusters based on the set of clock objects, the second set of clusters comprising a second number of dusters, the second set of clusters being generated prior to the first set of clusters, the second number of clusters being less than the first number of clusters; and determining, based on the machine-learning model, that at least one cluster in the second set of clusters is assessed to fail to satisfy one or more of the design rule constraints, wherein the first set of clusters is generated to include an incremented number of clusters based on determining that at least one cluster in the second set of clusters is assessed to fail to satisfy one or more of the design rule constraints.

12. The method of claim 11, further comprising:

prior to performing the timing analysis, performing one or more local cluster refinements on the set of clusters.

13. The method of claim 12, further comprising:

prior to performing the one or more cluster refinements, determining whether to perform the one or more local cluster refinements on the set of clusters based on a number of clusters indicated by a prior evaluation as failing to satisfy the one or more design rule constraints.

14. The method of claim 13, wherein the prior evaluation includes using the machine-learning model to assess one or more clusters fail to satisfy the one or more design rule constraints.

15. The method of claim 12, wherein performing the one or more local cluster refinements comprises one or more of:

performing a pin move refinement on one or more clusters in the set of clusters; and performing local reclustering on one or more clusters in the set of clusters.

16. The method of claim 10, further comprising generating the machine-learning model by using one or more machine-learning algorithms to analyze training data to find correlations among a set of identified features that affect whether clusters satisfy design rule constraints.

17. The method of claim 16, wherein:

the training data comprises clusters of clock sinks that are labeled according to respective satisfaction of the design rule constraints, and the set of identified features include one or more of: driver location, driver size, input slew of driver, number of sinks, sink sizes, sink locations, bounding box area, average clock net radius, routing topology, total wirelength, and resistance and capacitance characteristics.

18. The method of claim 10, wherein the one or more design rule constraints comprise at least one timing target.

* * * * *